United States Patent [19]

Frame

[11] Patent Number: 4,954,900

[45] Date of Patent: Sep. 4, 1990

[54] IMAGING AND WIDE SECTOR SEARCHING APPARATUS

[75] Inventor: Wayne W. Frame, Longmont, Colo.

[73] Assignee: Ball Corporation, Muncie, Ind.

[21] Appl. No.: 294,195

[22] Filed: Jan. 6, 1989

[51] Int. Cl.$^5$ .............................................. H04N 3/15
[52] U.S. Cl. .................................. 358/213.26; 358/909
[58] Field of Search .................. 358/213.26, 213.31, 358/909, 213.25, 213.29, 212, 213.19

[56] References Cited

U.S. PATENT DOCUMENTS

| | | | |
|---|---|---|---|
| 3,931,463 | 1/1976 | Levine | 178/7.1 |
| 4,280,141 | 7/1981 | McCann et al. | 358/213 |
| 4,354,104 | 10/1982 | Chikamura et al. | 250/211 J |
| 4,375,652 | 3/1983 | White | 358/213 |
| 4,577,115 | 3/1986 | Rentsch et al. | 250/578 |
| 4,581,652 | 4/1986 | Kinoshita et al. | 358/213.26 |
| 4,603,354 | 7/1986 | Hashimoto et al. | 358/909 |
| 4,644,405 | 2/1987 | Roy et al. | 358/213 |
| 4,646,142 | 2/1987 | Levine | 358/50 |
| 4,647,978 | 3/1987 | Kinoshita et al. | 358/213 |
| 4,651,215 | 3/1987 | Bell et al. | 358/213 |
| 4,656,520 | 4/1987 | Hurst | 358/213.26 |
| 4,663,669 | 5/1987 | Kinoshita et al. | 358/213.19 |
| 4,689,686 | 8/1987 | Hashimoto et al. | 358/213.26 |
| 4,695,889 | 9/1987 | Portmann | 358/213.26 |
| 4,717,945 | 1/1988 | Yusa et al. | 357/24 |
| 4,743,778 | 5/1988 | Takatsu et al. | 307/311 |
| 4,748,486 | 5/1988 | Miyatake | 357/30 V |
| 4,758,869 | 7/1988 | Eitan et al. | 357/23.5 |
| 4,829,368 | 5/1989 | Kobayashi et al. | 358/213.29 |

OTHER PUBLICATIONS

"An Overview of Solid-State Sensor Technology" by Koichi Sadashige, SMPTE Journal, Feb., 1987, pp. 180-185.

Primary Examiner—Stephen Brinich
Attorney, Agent, or Firm—Sheridan, Ross & McIntosh

[57] ABSTRACT

A dual mode imaging device is provided which employs a frame transfer charge device. The device comprises an image zone for receiving radiation and generating first output as a function of the amount of radiation received during a predetermined time period. A memory zone is employed to receive and store the first output during a first mode of operation as well as receive radiation and generate a second output as a function of the amount of radiation received during a second mode of operation. A shift register is provided for transmitting either the first output or the second output for processing.

20 Claims, 5 Drawing Sheets

IMAGING AND WIDE SECTOR SEARCHING APPARATUS

FIELD OF THE INVENTION

The present invention relates to an apparatus using a radiation-sensitive, frame transfer charge coupled device to alternately perform normal staring array imaging utilizing radiation initially received in an image zone, and wide sector searching employing radiation initially received in a memory zone.

BACKGROUND OF THE INVENTION

A typical frame transfer charge coupled device ("frame transfer CCD") comprises a vertically-oriented, oxide-covered silicon substrate upon which an array of horizontally-oriented, semi-transparent electrodes (e.g., polycrystalline silicon) are mounted. Vertically-oriented charge transfer channels within the substrate and beneath the horizontally-oriented electrodes are defined by electrically inactive p-type "channel-stop" regions. The horizontally-oriented electrodes are grouped into an upper "image zone" and a lower "memory zone". An array of vertically-oriented electrodes are also mounted on the substrate, and a horizontally-oriented charge transfer channel is provided thereunder within the substrate, to define a horizontal serial shift register adjacent to and below the memory zone. The serial shift register receives charges line-by-line from the vertical charge transfer channels, and provides a corresponding video signal to a charge detection amplifier mounted on the substrate. The amplifier transmits the video signal to an output.

When frame transfer CCDs are used in a normal staring mode, an optical image is focused upon the image zone, and due to resultant photon penetration through the electrodes and the electrical biasing of electrodes, charges are built-up, or integrated, over discrete time periods in "potential wells" within vertical charge transfer channel regions beneath biased electrodes. Such integrated charges, or frames, which are representative of the image, are then rapidly transferred by "charge coupling" to the memory zone. Charge coupling occurs by electrically and sequentially pulsing adjacent electrodes or sets thereof to establish differentials therebetween. Frames of charges held in the memory zone are then transferred line-by-line by charge coupling into the serial shift register, and each line is shifted out sequentially to the charge detection amplifier. The signal provided by the serial shift register is typically in a television-compatible format.

As will be appreciated by those skilled in the art, a memory zone has generally been employed to hold charges as a queue to the serial shift register. As such, it is readily understood that known memory zones are covered by continuous opaque shields to preclude receipt of radiation, thereby preserving the integrity of the charges stored thereby.

Levine's U.S. Pat. No. 3,931,463 discloses an apparatus for achieving image brightness control in a frame transfer CCD. As is conventional, the Levine device includes an image zone, a memory zone and a shift register having a number of stages equal to the number of charge transfer channels employed. A drain diffusion is provided at the image zone end of the charge transfer channels for receiving undesired charges from potential wells. By appropriate backward pulsing of the electrodes within the image zone, undesired charges in the image zone can be selectively "reversed clocked" to the drain diffusion. In the Levine system, effective noise resulting from feedthrough during charge transfer to the drain diffusion is reduced by performing the process during horizontal retrace periods of standard televisions.

For some applications, the horizontal retrace period is not long enough to allow all unwanted charge in the image zone to be drained. To overcome this problem, Bell, et al. U.S. Pat. No. 4,651,215, have proposed the use of a frame transfer CCD employing backward shifting of charge to a diffusion drain during active transmission periods. The Bell, et al. device includes means for applying reverse clocking pulses just before the start of integration periods at a frequency outside the output signal bandwidth.

In the Hashimoto, et al. frame transfer CCD device disclosed in U.S. Pat. No. 4,689,686, charges generated in at least a portion of the image zone are transferred down to the shift register for read-out at a high speed, at predetermined intervals, so that image data regarding photometering or distance metering or the like can be selectively obtained at high speed. This permits control operations for photometering or distance metering to be executed at a high speed. Hashimoto et al. contemplate use of an iris in connection with the image zone to control the amount of image radiation received in connection with the disclosed device.

The method of Roy, et al., disclosed in U.S. Pat. No. 4,644,405 is directed to selectively transferring image data received within a selected portion of an image zone to a memory zone for processing. By utilizing a selected portion in the image zone, Roy, et al. considerably reduce the time associated with transmitting corresponding charge from the CCD for processing.

Although the above-noted patents represent advances in the field of electronic image receipt and transmission, they do not specifically contemplate selective, alternate use of the corresponding disclosed CCD devices for normal staring array imaging and for scanning, or rotating, a CCD face across a wide field of interest, i.e., "wide sector searching". More particularly, such patents fail to disclose apparatus which are capable of operating in dual modes for normal staring array imaging and wide sector searching, while minimizing componentry, space and cost requirements, as well as operational problems.

SUMMARY OF THE INVENTION

Accordingly, the present invention is embodied in a novel, singular apparatus particularly adapted to alternately receive radiation and generate corresponding output in at least two modes of operation, namely normal staring array imaging and wide sector searching. The apparatus comprises a first means for receiving radiation and generating first output as a function of the amount of radiation received during predetermined integration time periods. A second means is provided for receiving and storing the first output during the first mode of operation, and for receiving radiation and generating a second output as a function of the amount of radiation received over predetermined integration time periods during the second mode of operation. Third means are also included for transmitting one of said first output and said second output for processing.

In a preferred embodiment, the invention employs a conventional frame transfer CCD. More particularly, such frame transfer CCD includes an image zone as the aforementioned first means of the invention, a serial shift register as the aforementioned third means of the invention, and of particular novelty, a memory zone as the aforementioned second means of the invention. Such unique usage of the memory zone is principally effected by providing a window in the opaque shield that typically covers the memory zone, thereby allowing for selective exposure of the memory zone to conventionally focused radiation during the second mode of operation. Conventional means are utilized to control the selective opening and closing of such window. Known time delay and integration principles are employed in connection with the memory zone during second mode operations.

Anti-blooming devices can be employed in the inventive apparatus to provide advantages during both first and second modes of operation. For example, by employing such devices to remove undesired charges generated within the image zone during the second mode of operation, leakage of such charges to the memory zone can be substantially precluded. Additionally or alternatively, reverse clocking and/or drain diffusion means can be advantageously employed in the apparatus.

Finally, the present invention contemplates use of appropriate means for mechanically scanning the dual mode imager about a wide sector defined by a predetermined azimuth and predetermined elevation during the second mode of operation. It is contemplated that such mechanical scanning means should include means for rotating the dual mode imager by a predetermined angle (e.g. 90°) with respect to the orientation assumed by the dual mode imager during the first mode of operation. The objectives of the mechanical scanning means are achieved by coupling the dual mode imager with a device having a roll axis and a gimbal arrangement.

As will be appreciated by those skilled in the art, the present invention obviates the need to employ separate devices to achieve normal staring array imaging and wide sector searching. Further, by incorporating a window for wide sector searching into the opaque shield covering the memory zone of a frame transfer CCD, componentry, space and cost requirements, as well as operational problems, can be further minimized. More particularly, such incorporation substantially minimizes any increased opaque shielding material, space or cost requirements, as well as increased clocking componentry (i.e., driver clocks and circuitry), space and cost requirements. Additionally, since the memory zone is selectively shielded from radiation during the first mode of operation, corresponding residual charge difficulties (i.e., "remnants phenomena") are effectively minimized. Finally, in applications where avoidance of "blooming" (i.e., overexposure) is required in the first mode of operation (i.e., normal staring array imaging), but is not required in the second mode of operation (i.e., wide sector searching), the present invention allows for optimal hardware design and operational results since two different and discrete zones are employed to receive radiation of interest in the two modes of operation. That is, in such applications, anti-blooming and/or other similar devices and processes need only be employed in connection with the image zone. As will be appreciated by those skilled in the art, it is desirable to avoid use of anti-blooming devices and attendant processes when the intended application does not require the same.

These and other features, advantages and objects of the present invention will be further understood and appreciated by those skilled in the art by reference to the following written specification, claims and appended drawings.

DETAILED DESCRIPTION OF THE PREFERRED EMBODIMENT

Figure 1:
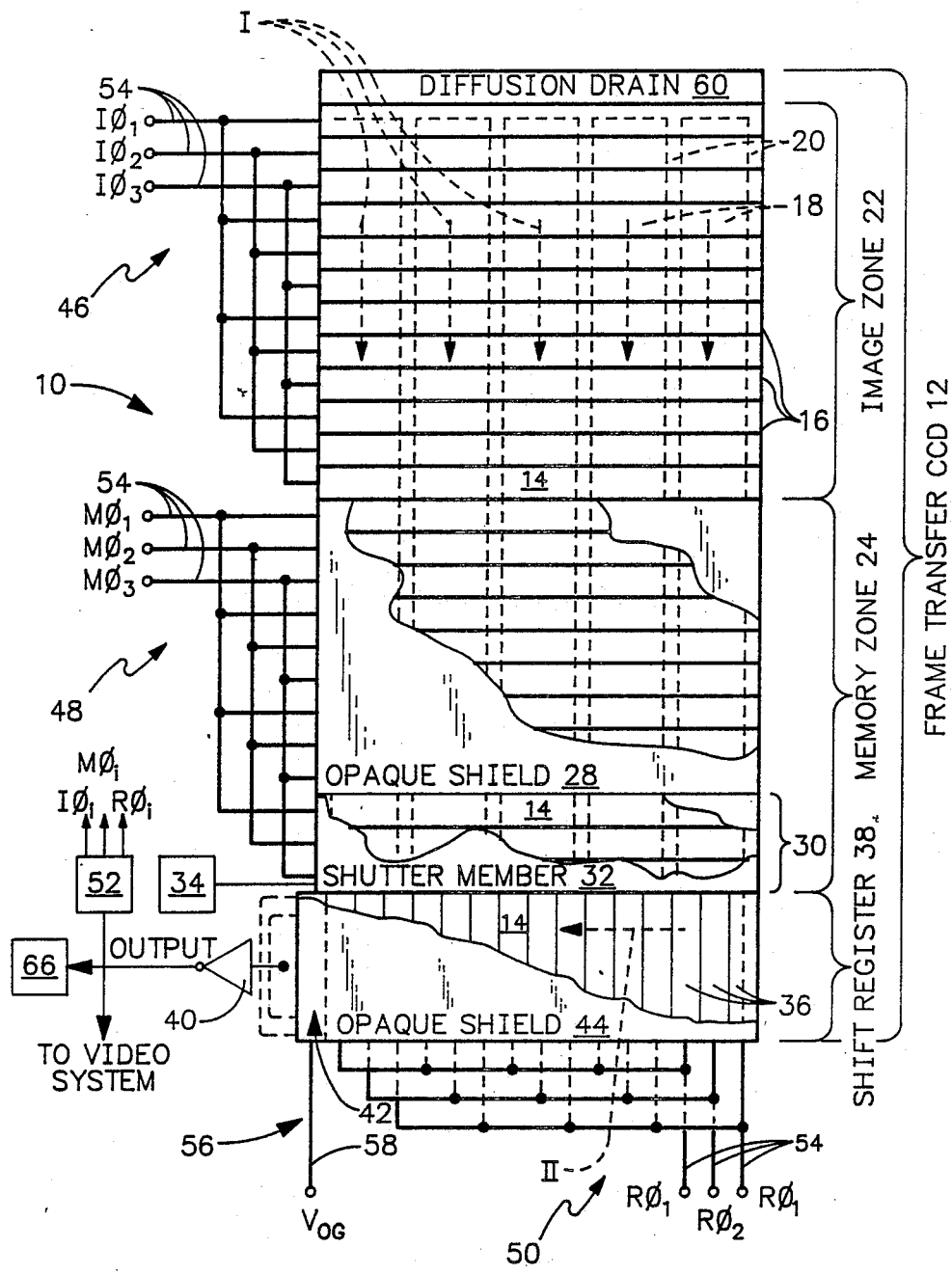
FIG. 1 is a representative view of an apparatus comprising the present invention, i.e., a dual mode imager, shown in a first mode of operation, superimposed on a schematic diagram of a frame transfer charge coupled device ("frame transfer CCD") with portions of a memory zone shield and closed window shutter broken away.

For purposes of description herein, the terms "upper," "lower," "right," "left," "rear," "front," "vertical," "horizontal" and derivatives thereof shall relate to the invention as oriented in FIG. 1. However, it is to be understood that the invention may assume various alternative orientations and step sequences except where expressly specified to the contrary. It is also to be understood that the specific devices and processes illustrated in the attached drawings, and described in the following specification, are simply exemplary embodiments of the inventive concepts defined in the appended claims. Hence, specific dimensions, and other physical characteristics relating to the embodiments disclosed herein are not to be considered as limiting, unless the claims by their language expressly state otherwise.

Figure 2:
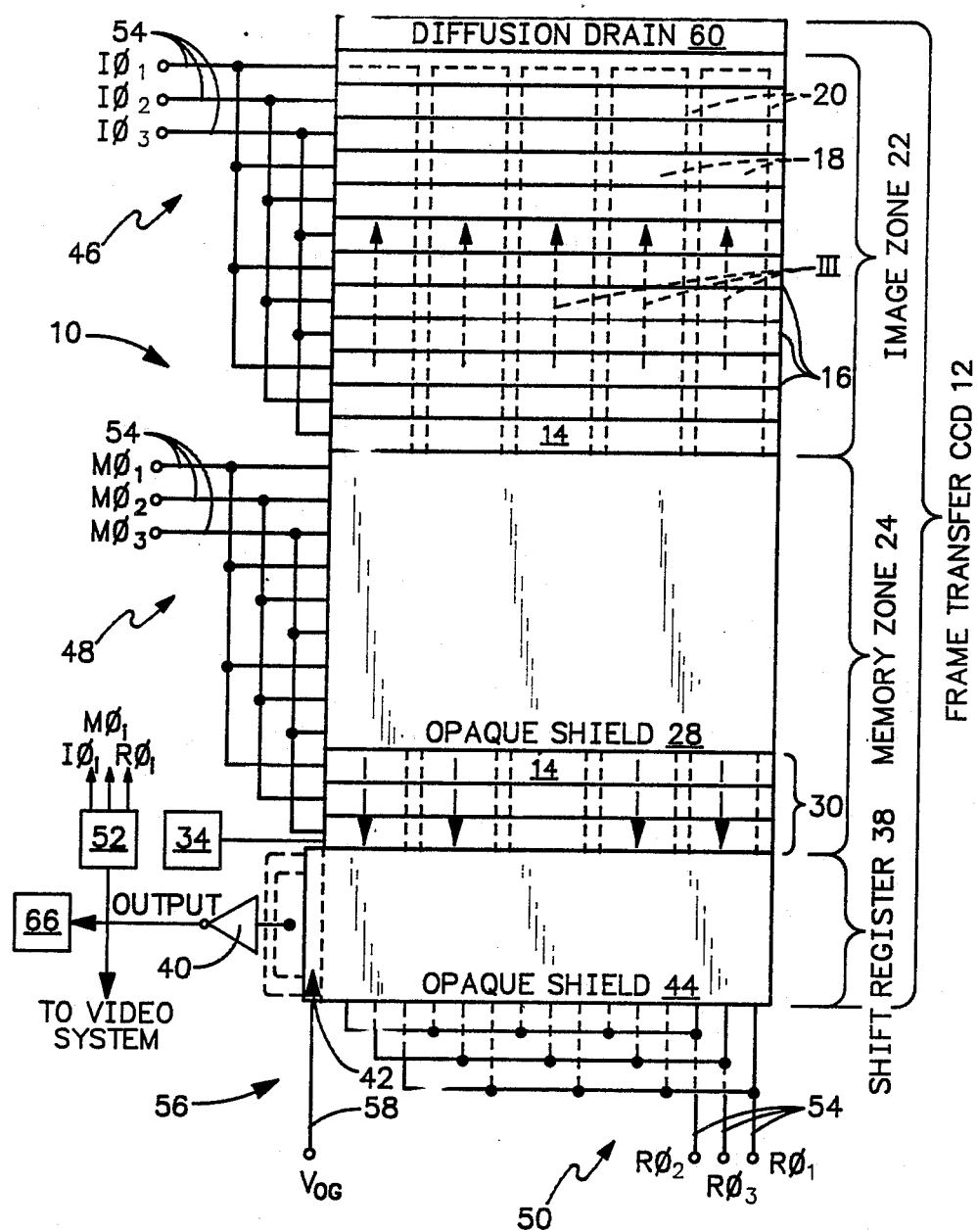
FIG. 2 is a representative view of the dual mode imager shown in a second mode of operation, superimposed on a schematic diagram of the frame transfer CCD, with the memory zone window shutter open.
Figure 3:
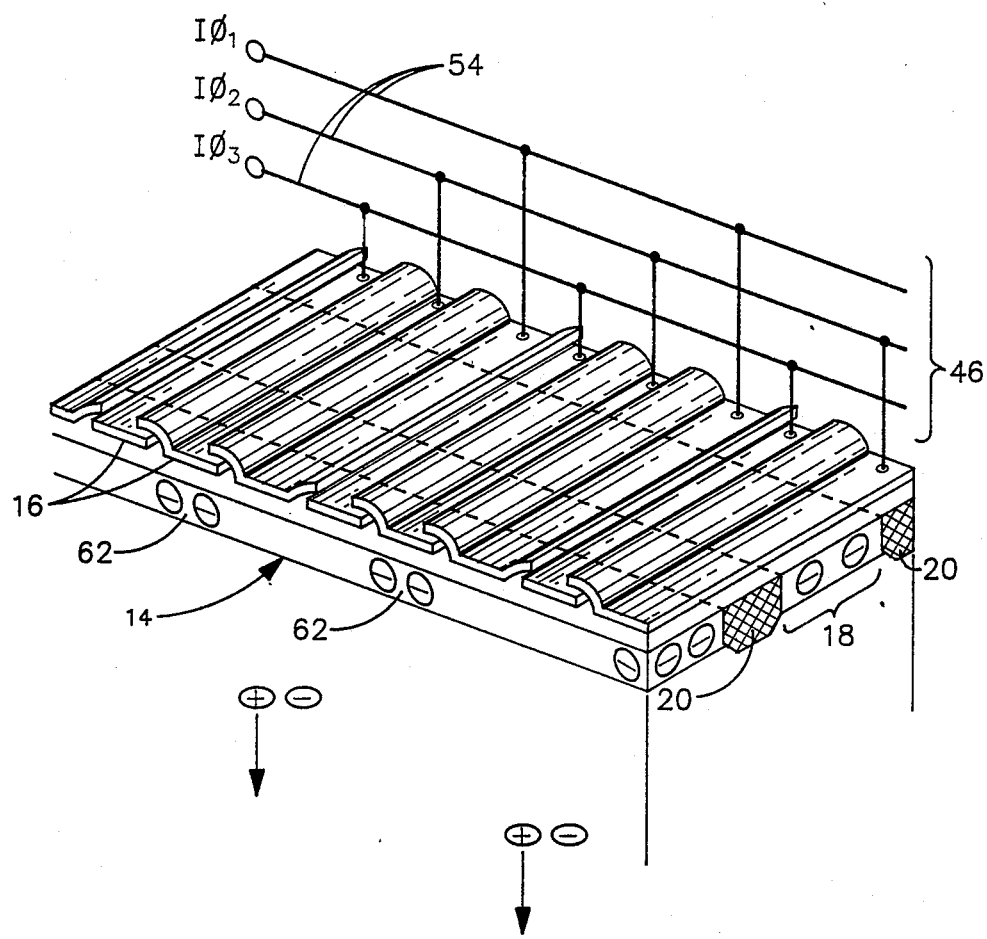
FIG. 3 is a fragmentary, perspective view of an integrated circuit arrangement disposed within an image zone of the dual mode imager.

FIG. 1 shows a dual mode imager 10 embodying the present invention. In the preferred embodiment, the dual mode imager 10 employs a frame transfer charge coupled device ("frame transfer CCD") 12 having a radiation-sensitive substrate 14 upon which semi-transparent electrodes 16 are horizontally deposited. By way of example, substrate 14 may be an oxide covered silicon substrate and electrodes 16 may be fabricated from polycrystalline silicon. Due to the semi-transparency of electrodes 16, when radiation encounters electrodes 16, photons will penetrate the electrodes 16 and generate electron-hole pairs in the underlying radiation-sensitive substrate 14. The accumulation of charge within radiation-sensitive substrate 14 is a function of radiation intensity and duration of exposure (i.e., the desired charge integration time period). As illustrated in FIGS. 1-3, a plurality of side-by-side charge accumulation and transfer channels 18 are defined and separated from each other within substrate 14 by channel stop regions 20.

In the exemplary frame transfer CCD 12 of FIG. 1, a limited number of electrodes 16, charge transfer channels 18 and channel stop regions 20 are shown for purposes of illustration. As will be appreciated, however, there would be considerably more of such components in an actual embodiment, and their number would generally depend on the desired size of the field of vision of dual mode imager 10 and any constraints of the video system being employed therewith.

As typical, electrodes 16 are grouped into an image zone 22 and a memory zone 24. Image zone 22 is normally exposed to incoming radiation, and conventional first focusing means 26 (not shown) are provided to focus images upon the image zone 22. Such first focusing means 26 could, for example, include an arrangement of lenses.

An opaque shield 28 is provided to shield the memory zone 22 from receipt of undesired radiation. Of particular importance, opaque shield 28 is provided with a shutter member 32 which can be selectively opened to define a window 30. Opaque shield 28 and the shutter member 32 thereof may be constructed from aluminum or any other material suitable for preventing transmission of radiation. Shutter member 32 may be of a conventional vane-type construction. In the present example, the opening and closing of shutter member 32 is controlled by electronic shutter control means 34.

Radiation-sensitive substrate 14 extends below memory zone 24 and is overlaid by a plurality of vertically-oriented electrodes 36. Typically, substantially all of electrodes 36 are grouped for use as a serial shift register 38. As illustrated in FIG. 1, serial shift register 38 is operatively coupled with a charge detection amplifier 40. At least one of electrodes 36, and a corresponding portion of radiation-sensitive substrate 14, form an output gate 42 which is positioned between shift register 38 and amplifier 40. Shift register 38 and output gate 42 are encompassed by opaque shield 44 which may be constructed from the same materials as opaque shield 28.

Electrodes 16 associated with image zone 22 and memory zone 24 are operatively coupled with pulsing circuits 46 and 48, respectively, while electrodes 36 associated with serial shift register 38 are operatively coupled with pulsing circuit 50. In the preferred embodiment, pulsing circuits 46, 48 and 50 are conventional "three-phase structures" to which pulsing signals $I\phi_i$, $M\phi_i$ and $R\phi_i$ may be selectively and sequentially applied, respectively, by clock pulse generating means 52. Pulse generating means 52 is provided with the ability to transmit pulses $I\phi_i$, $M\phi_i$ and $R\phi_i$ to drive frame transfer CCD 12, thus effecting charge transfer from the image zone 22 to charge detection amplifier 42. In one embodiment, the functions of shutter control means 34 and pulse generating means 52 could be integrated into a single control system.

As shown in FIGS. 1–3, each of pulsing circuits 46, 48 and 50 include a plurality of "triplet sets" of pulsing conductors 54. Any given triplet set is connected to three adjacent horizontal rows of electrodes 16 or three adjacent vertical columns of electrodes 32. For the exemplary frame transfer CCD 12, a single "pixel" within the image zone 22 and memory zone 24, as such term is known to those skilled in the art, is defined by three adjacent electrodes 16 coupled with a triplet set of pulsing conductors 54 and laterally bounded on each side by channel stop regions 20. With respect to the exemplary frame transfer CCD 12 of FIG. 1 then, each the image zone 22 and memory zone 24 have an array of four lines of five pixels each.

Charge detection amplifier 40 is electrically shielded from shift register 38 through use of a biasing circuit 56 which includes a conductor 58. The shielding between shift register 38 and amplifier 40 is effected by applying a fixed DC bias, $V_{og}$, at output gate 42.

A drain diffusion 60 may be provided at the upper end of image zone 22 to receive undesired charge transferred thereto from image zone 28. Charge can be "dumped" for example, into drain diffusion 60 by pulsing $I\phi_i$ in a manner that allows charge to be transferred along charge transfer channels 18 away from memory zone 24, i.e. through "reverse clocking". Additionally, drain diffusion 60 may be employed to receive undesired charge transmitted thereto by gated "anti-blooming" devices as further discussed below.

In the preferred embodiment, it is desirable to have the capability to rotate dual mode imager 10 to a horizontal orientation (see FIGS. 4A and 5), and to pan the dual mode imager 10 within a desired azimuth and elevation range. Such capabilities can be realized through use of known means, such as a device (not shown) having a roll axis operatively associated with a gimbal arrangement.

In a first mode of operation (FIG. 1), during which dual mode imager 10 is employed to provide normal staring array imaging, "integration" occurs as radiation is focused on image zone 22 with first focusing means 26 (not shown). During integration periods, one of the electrodes 16 associated with each triplet set of pulsing conductors 54 is held at a given bias voltage level (see FIG. 3) by the corresponding pulsing conductor 54 of pulsing circuit 46, thus defining "potential wells" 62 for accumulating, or integrating, charges within radiation-sensitive substrate 14.

As is known in the art, it is not uncommon to encounter charge overload from potential wells due to over exposure. It has been proposed that such overload, or "blooming", can be alleviated by use of "reverse clocking" and/or "anti-blooming" devices. Such devices are typically incorporated within an image zone for removing charge in excess of a predetermined threshold level. As appreciated by those in the art, known anti-blooming devices encompass the concepts of "surface draining," "vertical draining," and "charge pumping" along or through substrate 14. Such known concepts and corresponding devices may be utilized as desired in the present invention, including first mode operations thereof.

At the end of each integration period during first mode operation, electrodes 16 are sequentially pulsed with signals $I\phi_i$ and $M\phi_i$ via pulsing circuits 46 and 48 to "cascade" a first output, i.e. a frame set of charges, down transfer channels 18 in a direction indicated by arrows I in FIG. 1. During the first mode of operation, shutter member 32 is maintained in a closed position, so that all of memory zone 24 is secluded from radiation by opaque shield 28. Shift register 38 is also secluded from radiation by opaque shield 44. Lines of charge frames are transferred into shift register 38 by sequentially applying signals $M\phi_i$ and $R\phi_i$ to electrodes 16 and 36 via pulsing circuits 48 and 50. As each line is transferred into shift register 38, pulsing signals $R\phi_i$ are applied to electrodes 36 from pulsing circuit 50 such that the charge contained within the line is shifted in serial fashion from shift register 38 to amplifier 40, along a line consistent with arrow II, to provide output suitable for use in a video system. To ensure that shift register 38 is emptied before the next line arrives, a much greater frequency is typically used for three-phase voltages R$\phi_i$ than for M$\phi_i$. It should be recognized that use of three-phase voltages is not the only means by which to facilitate pulsing of charges from image zone 22 to amplifier 40. Other pulsing circuitry could be substituted for the presently illustrated system without substantially altering the function of dual mode imager 10.

In a novel second mode of operation, as shown in FIG. 2, charges accumulated in image zone 22 are segregated from memory zone 24, and window 30, as defined by shutter member 32, is advantageously employed to facilitate wide sector searching. During the second mode of operation, charges accumulated in transfer channels 18 within image zone 22 are not cascaded to memory zone 24. Essentially, image zone 22 is "shut down" during the second mode of operation. That is, in the preferred embodiment of the second mode of operation, undesired charge generated through receipt of radiation within image zone 22 can be removed, for example, through the employment of gated, surface draining anti-blooming devices incorporated within image zone 22. Such gated devices are able to remove the undesired charge via arrangements of vertically oriented electrodes positioned over n-type materials disposed within the surface of channel stop regions 20. That is, n-type materials are positioned relative to p-type materials of channel stop regions 20, and the associated electrodes are electrically biased such that undesired charge is attracted to the n-type materials. Additionally, the anti-blooming electrodes can be pulsed to remove the undesired charge received by the n-type materials away from memory zone 24 for dumping, possibly in diffusion drain 60 as noted hereinabove. Alternatively, undesired charge generated in image zone 22 during the second mode of operation can be disposed of by reverse clocking the same in a direction consistent with arrows III, using pulsing circuit 46.

While dual mode imager 10 is being operated in the second mode of operation, i.e., wide sector searching, shutter member 32 is opened such that the underlying portion of memory zone 24 is exposed to radiation. The incoming radiation may be focused upon such portion by either shifting the optical axis of first focusing means 26 (not shown) to be centered on window 28 or providing a second focusing means 64 (not shown) operating independent of first focusing means 26 and dedicated to exclusive use with window 28 in the second mode of operation. Upon opening shutter member 32, integration occurs, and potential wells 62 are defined within the corresponding portion of the radiation-sensitive substrate 14 in a manner analogous to that described above with respect to first mode operation.

In the preferred embodiment, second mode operation entails the employment of known time delay and integration principles. More specifically, biasing and pulsing signals M$\phi_i$ are sequentially applied during integration to adjacent electrodes 16 that are exposed to radiation by window 30 at a rate commensurate with the relative image motion across such electrodes. The relative motion results from scanning or slewing of the gimbal arrangement. For example, in a dual mode imager 10 rotated 90° from first mode operation, consider a line of ten pixels having three corresponding, vertically-oriented electrodes each, being scanned through a 1° field of view at a rate of 1°/sec. As the line of pixels is scanned across the 1° field of view, integration associated with a particular image within such field occurs at the first electrode within 1/30 sec. By the time integration has occurred at the second electrode within 2/30 sec., the charge from the first electrode has been pulsed to and added with the charge formed at the second electrode. This process continues, with charge from the second electrode being added to the integrated charge at the third electrode, and so on, until, at the end of one second and 1° of scanning, the charge accumulated as a result of integrating and pulsing charges along the electrodes can be outputted at the 30th electrode. That is, the accumulated charge at the 30th electrode represents the corresponding image. Such principles of time delay and integration are well known to those skilled in the art.

Figures 4A, 4B:
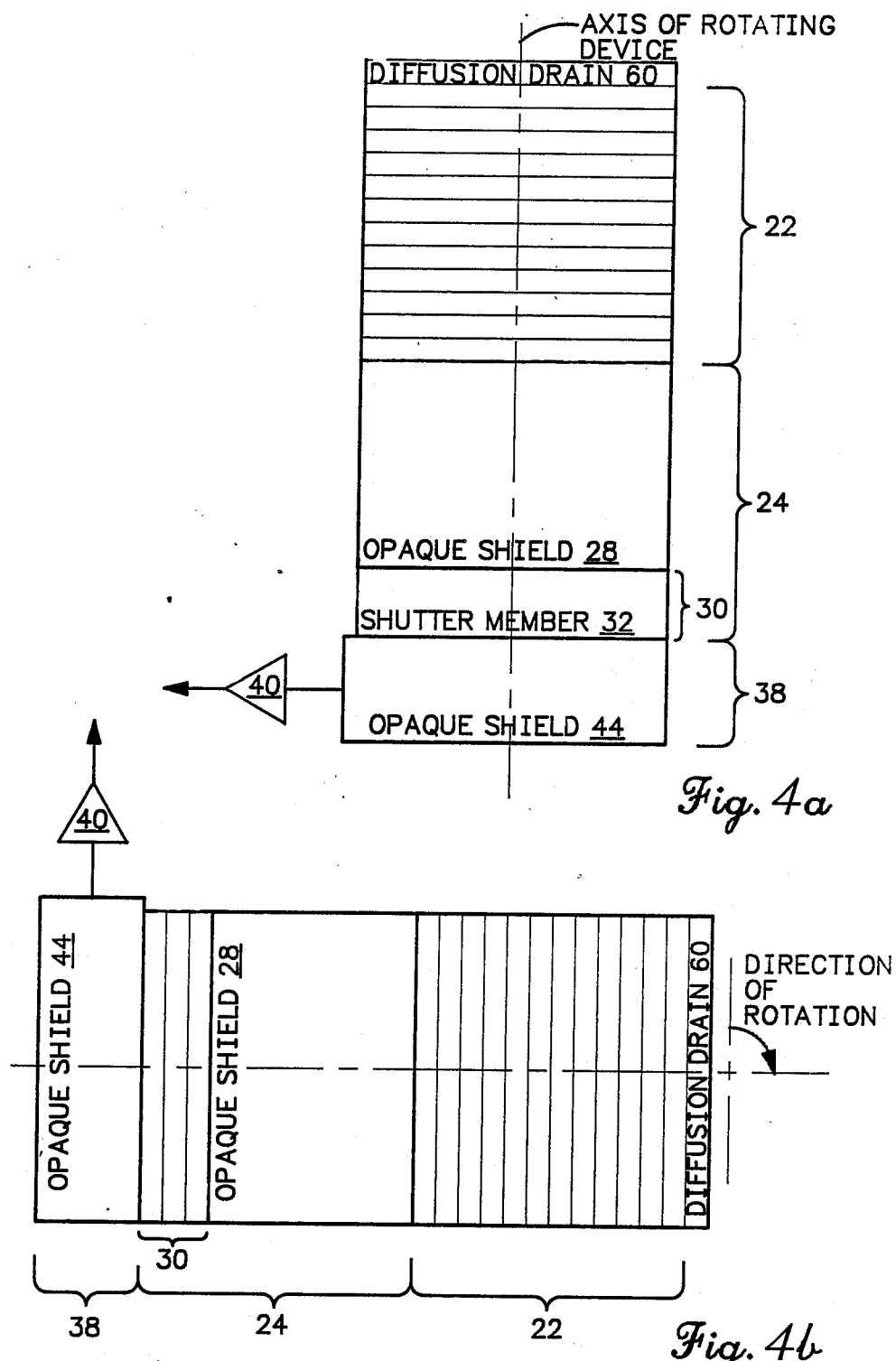
FIG. 4A is a representative view of the dual mode imager superimposed on a schematic diagram of the frame transfer charge, coupled device positioned for use in a first mode of operation.
FIG. 4B is a representative view of the dual mode imager superimposed on a schematic diagram of the frame transfer charge coupled device rotated 90° for use in a second mode of operation.
Figure 5:
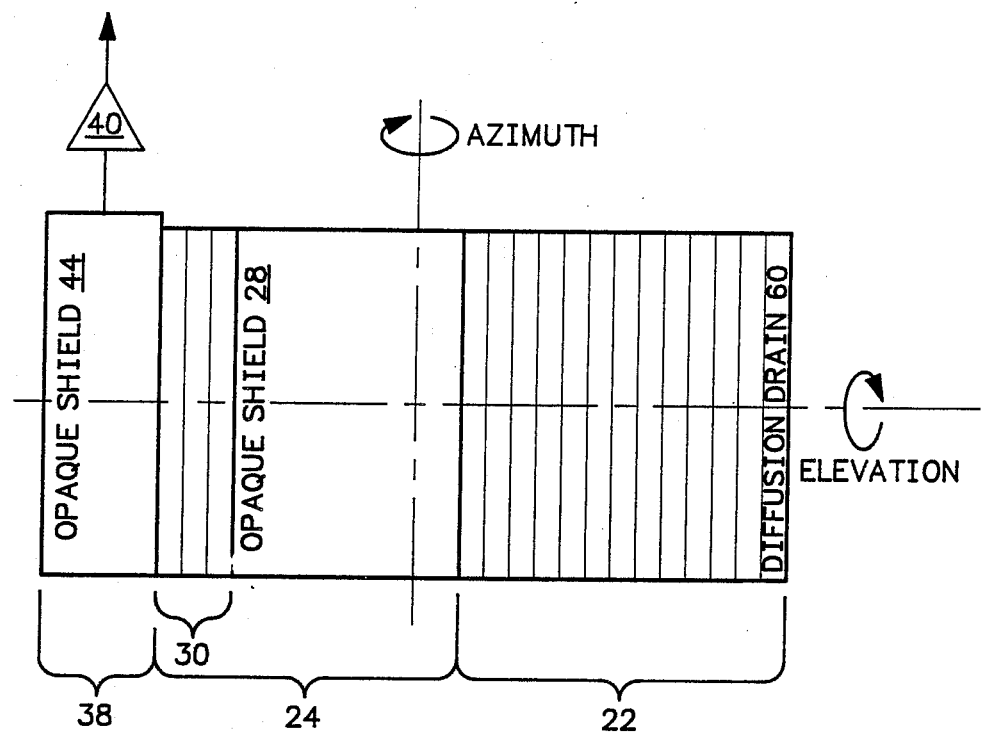
FIG. 5 is a representative view of the dual mode imager superimposed on a schematic diagram of the frame transfer charge coupled device in a second mode of operation with indicators as to azimuth and elevation.

In the preferred embodiment, the first mode of operation is typically effected with dual mode imager 10 in the upright position as in FIG. 1. As noted, in the second mode of operation, i.e. wide sector searching, it will be desirable to rotate dual mode imager 10 by 90° as shown in FIGS. 4A and 5. As will be appreciated, optimum scanning ability is achieved when dual mode imager 10 is rotated by 90°.

In some applications, it may be desirable to simply evaluate second output from amplifier 40 with conventional processing means 66, as opposed to image reproduction in a video system. When so evaluating output in the second mode of operation, the dual mode imager 10 could, for example, be employed to simply identify the presence of objects of interest, such as projectiles moving at high speeds, and subsequently view such objects with the first mode of operation, i.e. normal staring array imaging.

In the presently contemplated best mode, each of image zone 22 and memory zone 24 include arrays of 405 lines by 1032 pixels. It has also been determined by experimentation that window 30 can achieve acceptable results when defined to be approximately 32 lines high. The height of window 30 is optimized, of course, by balancing various factors, such as desired sensitivity and scan rate accuracy for the intended application. While in the preferred embodiment window 30 is formed immediately above shift register 38, window 30 could also be positioned in alternative locations within opaque shield 28 without substantially impairing the function of the device in the second mode of operation. As presently contemplated, wide sector searching can cover a 5°–8° elevation range (FIG. 5) and 120°–180° azimuth range. The presently intended slew rate has an approximate range of 10°/sec. to 60°/sec.

Based on the above detailed description, salient features of the present invention can be easily recognized. The disclosed dual mode imaging apparatus provides a first means for receiving radiation and generating first output as a function of the amount of radiation received during a predetermined time period. A second means is advantageously employed to receive and store the first output during a first mode of operation, as well as receive radiation and generate a second output as a function of the amount of radiation received during a second mode of operation. Third means is provides for transmitting either the first output or the second output for processing. As further elaborated upon hereinabove, a novel approach for providing the apparatus with dual mode imaging capability allows for minimization of componentry, space and cost requirements, as well as reduction of operational problems.

What is claimed is:

1. An apparatus comprising:
   first means for receiving radiation and generating first output as a function of the amount of radiation received during a predetermined time period;
   second means for receiving and storing said first output from said first means during a first mode of operation, and for receiving radiation and generating a second output as a function of the amount of radiation received during a second mode of operation; and
   third means for transmitting one of said first output and said second output for processing.

2. The apparatus of claim 1, wherein:
   at least one of said first means, second means and third means comprises a frame transfer charge coupled device.

3. The apparatus of claim 1, wherein:
   said first means includes an image zone comprising a radiation-sensitive substrate and electric means for selectively transmitting said first output away from said image zone.

4. The apparatus of claim 1, wherein:
   said second means includes a memory zone comprising radiation-sensitive substrate and electric means for selectively transmitting one of said first output and said second output away from said memory zone.

5. The apparatus of claim 1, wherein:
   said third means includes a shift register having a radiation-sensitive substrate and electric means for selectively transmitting one of said first output and said second output away from said shift register.

6. The apparatus of claim 1, further comprising:
   means for focusing incoming radiation on one of said first means and said second means.

7. The apparatus of claim 1, further comprising:
   means for substantially preventing said second means from receiving radiation during said first mode of operation.

8. The apparatus of claim 7, wherein:
   said means for substantially preventing said second means from receiving radiation during said first mode of operation includes an opaque shield.

9. The apparatus of claim 1, further comprising:
   means for substantially preventing said second means from receiving first output during said second mode of operation.

10. The apparatus of claim 9, wherein:
    said means for substantially preventing said second means from receiving first output during said second mode of operation includes anti-blooming means.

11. The apparatus of claim 9, wherein:
    said means for substantially preventing said second means from receiving first output during said second mode of operation includes reverse clocking means.

12. The apparatus of claim 1, further comprising:
    means for rotating the apparatus from a first predetermined position to a second predetermined position such that the apparatus can be selectively oriented in accordance with the desired mode of operation.

13. The apparatus of claim 12, wherein:
    said means for rotating the apparatus includes a roll axis operatively associated with a gimbal.

14. The apparatus of claim 1, further comprising:
    means for causing said second output to be a function of only the amount of radiation received by a limited, predetermined portion of said second means during said second mode of operation.

15. The apparatus of claim 14, wherein:
    said means for causing said second output to be a function of only the amount of radiation received by a limited, predetermined portion of said second means during said second mode of operation includes an opaque shield having a shutter member which can be selectively opened to define a window in the opaque shield.

16. A dual mode imaging apparatus comprising:
    an image zone for receiving radiation and generating a first output as a function of the amount of radiation received during a predetermined time period;
    a memory zone for receiving and storing said first output during a first mode of operation and for receiving radiation and generating a second output as a function of the amount of radiation received during a second mode of operation;
    an opaque shield for substantially preventing said memory zone from receiving radiation during said first mode of operation, said opaque shield including a shutter member which can be selectively opened to define a window, wherein said window permits radiation to be received by a limited, predetermined portion of said memory zone during said second mode of operation; and
    a shift register for transmitting one of said first output and said second output for processing.

17. The apparatus of claim 16, further comprising:
    means for focusing incoming radiation on one of said image zone and said memory zone.

18. The apparatus of claim 16, further comprising:
    means for substantially preventing said memory zone from receiving first output from said image zone during said second mode of operation.

19. The apparatus of claim 16, further comprising:
    means for rotating the dual mode imaging apparatus from a first predetermined position to a second predetermined position such that the dual mode imaging apparatus can be selectively oriented in accordance with the desired mode of operation.

20. The apparatus of claim 19 further comprising:
    gimbal means for selectively panning said window across a desired azimuth range and elevation range during said second mode of operation.

* * * * *

UNITED STATES PATENT AND TRADEMARK OFFICE
CERTIFICATE OF CORRECTION

PATENT NO. : 4,954,900
DATED : September 4, 1990
INVENTOR(S) : Frame

It is certified that error appears in the above-identified patent and that said Letters Patent is hereby corrected as shown below:

Column 4, line 19, please delete "one" and insert therefor -- zone --.

Signed and Sealed this

Eleventh Day of February, 1992

Attest:

HARRY F. MANBECK, JR.

*Attesting Officer*  *Commissioner of Patents and Trademarks*